(12) United States Patent
White, III et al.

(10) Patent No.: US 10,883,683 B2
(45) Date of Patent: Jan. 5, 2021

(54) LED DRIVER SYSTEM FOR STREETLIGHTS

(71) Applicant: CIMCON Lighting, Inc., Billerica, MA (US)

(72) Inventors: William Anthony White, III, Carlisle, MA (US); Anil Agrawal, Westford, MA (US)

(73) Assignee: CIMCON Lighting, Inc., Bedford, MA (US)

( * ) Notice: Subject to any disclaimer, the term of this patent is extended or adjusted under 35 U.S.C. 154(b) by 0 days.

(21) Appl. No.: 16/281,193

(22) Filed: Feb. 21, 2019

(65) Prior Publication Data

US 2020/0271292 A1    Aug. 27, 2020

(51) Int. Cl.
| | |
|---|---|
| *F21V 19/02* | (2006.01) |
| *F21S 8/08* | (2006.01) |
| *F21V 23/00* | (2015.01) |
| *F21V 15/01* | (2006.01) |
| *H05K 7/20* | (2006.01) |
| *H05B 45/10* | (2020.01) |
| *H05B 45/37* | (2020.01) |
| *H05B 47/185* | (2020.01) |
| *F21Y 115/10* | (2016.01) |
| *F21W 131/103* | (2006.01) |

(52) U.S. Cl.
CPC .............. *F21S 8/085* (2013.01); *F21V 15/01* (2013.01); *F21V 23/008* (2013.01); *H05B 45/10* (2020.01); *H05B 45/37* (2020.01); *H05B 47/185* (2020.01); *H05K 7/2039* (2013.01); *F21W 2131/103* (2013.01); *F21Y 2115/10* (2016.08)

(58) Field of Classification Search
CPC .............................. F21V 15/01; F21V 23/008
See application file for complete search history.

(56) References Cited

U.S. PATENT DOCUMENTS

| | | | | |
|---|---|---|---|---|
| 2008/0080196 A1* | 4/2008 | Ruud | ...................... | F21S 2/005 |
| | | | | 362/373 |
| 2015/0319825 A1* | 11/2015 | Destine | .............. | H05B 37/0227 |
| | | | | 315/153 |
| 2016/0187555 A1* | 6/2016 | Yuan | ...................... | G02B 6/002 |
| | | | | 362/343 |
| 2017/0303177 A1* | 10/2017 | Ngounou | .............. | H04W 76/38 |

OTHER PUBLICATIONS

ZhagaStandard.org [online], "Book 18: Outdoor connectivity interface for smart luminaires," Dec. 18, 2017, [retrieved on May 21, 2019], retrieved from: URL<https://www.zhagastandard.org/books/book18>, 5 pages.

* cited by examiner

*Primary Examiner* — Joseph L Williams
*Assistant Examiner* — Jacob R Stern
(74) *Attorney, Agent, or Firm* — Fish & Richardson P.C.

(57) ABSTRACT

A streetlight system includes a streetlight housing that houses a light source and a driver device. The driver device includes a driver circuit for driving the light source in the streetlight housing. The driver device is exterior to the streetlight housing. The streetlight housing is coupled to the driver device by a connector configured to electrically connect the driver circuit to the light source. The driver circuit is configured to receive electrical power through the connector from a power source in the streetlight housing.

27 Claims, 7 Drawing Sheets

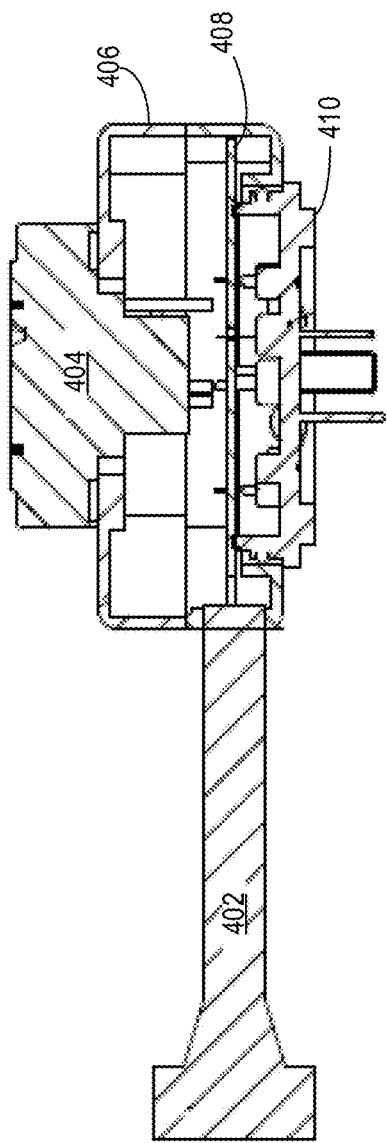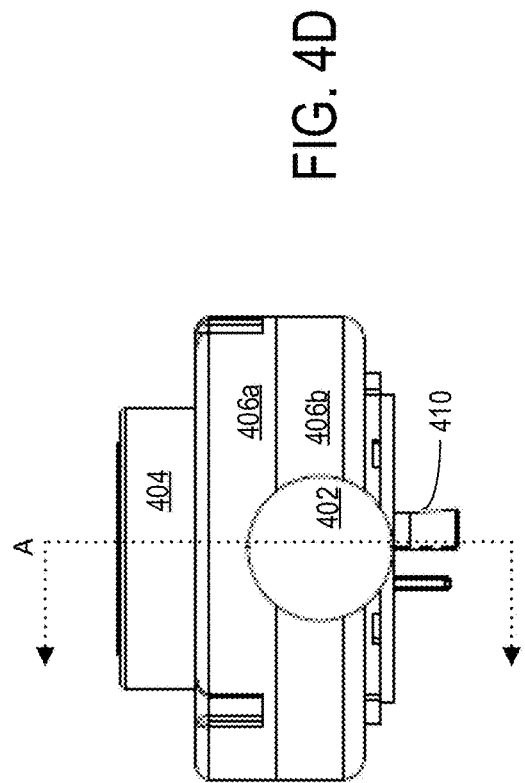
FIG. 4C
FIG. 4D

LED DRIVER SYSTEM FOR STREETLIGHTS

TECHNICAL FIELD

This disclosure generally relates to power driver devices for streetlight systems.

BACKGROUND

Many traditional streetlights include light sources that emit light using excited gas technology. A ballast provides an excitation current to the gas bulb to ionize the gas within the bulb and maintain a current through the gas, causing the gas in the bulb to emit light. Both gas bulbs, and the ballasts that drive them, are generally housed within the same enclosure as the bulb.

SUMMARY

The driver device of the streetlight system described herein provides several advantages. By disposing the driver device outside of a streetlight light enclosure that houses long-lasting LEDs, replacement of the driver device can be streamlined by avoiding having to access the interior of the streetlight enclosure. For example, in contrast to the long (e.g., multi-decades at times) service life of streetlight LEDs, the corresponding drivers often fail relatively quicker (e.g., in ten years or less). Because the driver devices described herein are external to the streetlight housing, such devices can be removed and replaced without opening the streetlight housing or requiring rewiring of the streetlight circuitry, which in turn improves the streetlight management process. In some cases, disposing the driver device outside of a streetlight housing makes the device amenable to be removed by an automated device such as an unmanned aerial vehicle (sometimes referred to as a drone).

Additionally, the driver device maintains a suitable operational environment for the driver circuitry to extend the life span of the driver circuitry. The driver device includes a temperature control system that maintains a cool operating temperature relative to the temperatures inside the ballast chamber of the streetlight housing. Overall, the driver device of the streetlight system described herein may mitigate the problem of labor-intensive repair of the streetlight and reduce the degenerating effects of elevated temperatures within the streetlight housing on the driver device.

In an aspect, the streetlight system includes a streetlight housing that houses a light source. The streetlight system further includes a driver device including a driver circuit for driving the light source in the streetlight housing. The driver device is disposed outside the streetlight housing, and the streetlight housing is coupled to the driver device by a connector configured to electrically connect the driver circuit to the light source. The driver circuit is configured to receive electrical power through the connector from a power source in the streetlight housing.

In some implementations, the light source comprises one or more light emitting diodes (LEDs). In some implementations, the driver device comprises a first connector is on a first side of a housing of the driver device and a second connector on a second, opposite side of the housing of the driver device. The housing is configured to couple to the streetlight housing and an additional device in a stacking configuration.

In some implementations, the streetlight system includes a pass-through circuit from the first connector to the second connector configured to electrically connect the power source to the additional device.

In some implementations, the driver circuit is connected to the second connector to drive the electrical power from the power source for the additional device. The additional device includes a controller configured to communicate with a remote device and control the electrical power provided to the light source.

In some implementations, the second connector comprises one or more ports for connecting one or more respective control lines from the controller to the driver circuit.

In some implementations, the controller is configured to provide a dimming signal to the driver circuit, and where the driver circuit is configured to adjust the electrical power provided to the light source in response to the dimming signal.

In some implementations, the driver device comprises a controller that comprises one or more processing devices. In an example, the controller is configured to send a control signal generated by the one or more processing devices to the driver circuit. In an example, the controller is configured to provide scheduling of operation of the light source and where the controller is configured to store data representing operating parameters of the light source.

In some implementations, the driver device comprises a light sensor configured to provide a signal to the controller, the signal representing an amount of light in an environment of the streetlight housing.

In some implementations, the connector comprises a C136.41 socket. In an example, the connector comprises a seal to shield the connector from weather. In an example, the connector comprises an approximately eighth-turn to quarter-turn locking mechanism.

In some implementations, the driver device includes a cooling element configured to reduce an operating temperature of at least portion of the driver circuit from a baseline operating temperature without the cooling element. In an example, the cooling element comprises a sun shield. In an example, the cooling element comprises a heat sink on an exterior of the driver device, the heat sink being in thermal communication with the driver circuit.

In some implementations, the driver circuit includes a switching mode power circuit.

In some implementations, the driver device includes one or more markings that provide orientation information to a remote device for autonomous connection or removal of the driver device with the streetlight housing. The driver device comprises a semi-rigid surface configured to conform to the streetlight housing.

In an aspect, a driver device includes a driver circuit configured to receive electrical power from a power source for driving a light source disposed in a streetlight housing. The driver device includes a housing that houses the driver circuit. The driver device further includes a first connector on the housing configured to couple with a connector of the streetlight housing and configured to connect the driver circuit to the power source and to the light source. The driver device includes a second connector on the housing configured to couple with an additional device to electrically connect the additional device to the light source.

In some implementations, the light source includes one or more light emitting diodes (LEDs). In some implementations, the first connector is on a first side of the housing. The second connector is on a second, opposite side of the housing. The housing is configured to couple to the streetlight housing and the additional device in a stacking configuration.

In some implementations, the driver device includes a pass-through circuit from the first connector to the second connector configured to electrically connect the power source to the additional device. In some implementations, the driver circuit is connected to the second connector to drive the electrical power from the power source for the additional device.

In some implementations, the additional device includes a controller configured to communicate with a remote device and control the electrical power provided to the light source. For example, the controller is configured to provide a dimming signal to the driver circuit. The driver circuit is configured to adjust the electrical power provided to the light source in response to the dimming signal. In an example, the controller is configured to provide scheduling of operation of the light source and where the controller is configured to store data representing operating parameters of the light source. In an example, the driver device includes a controller that is housed in the housing, the controller including one or more processing devices. The controller is configured to send a control signal generated by the one or more processing devices to the driver circuit.

In some implementations, the additional device comprises a photocell. For example, the driver device includes a light sensor configured to provide a signal to the controller, the signal representing an amount of light in an environment of the streetlight housing.

In some implementations, the second connector includes one or more ports for connecting one or more respective control lines from the controller to the driver circuit. In an example, the second connector includes a C136.41 socket. In an example, the first connector and the second connector each includes a seal to shield the respective connector from weather. In an example, one or both of the first connector and the second connector includes an approximately eighth-turn to quarter-turn locking mechanism.

In some implementations, the housing includes a cooling element configured to reduce an operating temperature of at least portion of the driver circuit from a baseline operating temperature without the cooling element. In an example, the cooling element comprises a sun shield. In an example, the cooling element comprises a heat sink on an exterior of the housing, the heat sink being in thermal communication with the driver circuit.

In some implementations, the driver circuit comprises a switching mode power circuit. In some implementations, the housing comprises one or more markings that provide orientation information to a remote device for autonomous connection or removal of the first connector with streetlight housing. In some implementations, the housing includes a semi-rigid surface that comprises the first connector, the semi-rigid surface configured to conform to the streetlight housing.

Two or more of the features described in this disclosure, including those described in this summary section may be combined to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

FIGS. 4A-4D show example form factors for a housing of a driver device for interfacing with a streetlight.

Like reference symbols in the various drawings indicate like elements.

DETAILED DESCRIPTION

Figure 1:
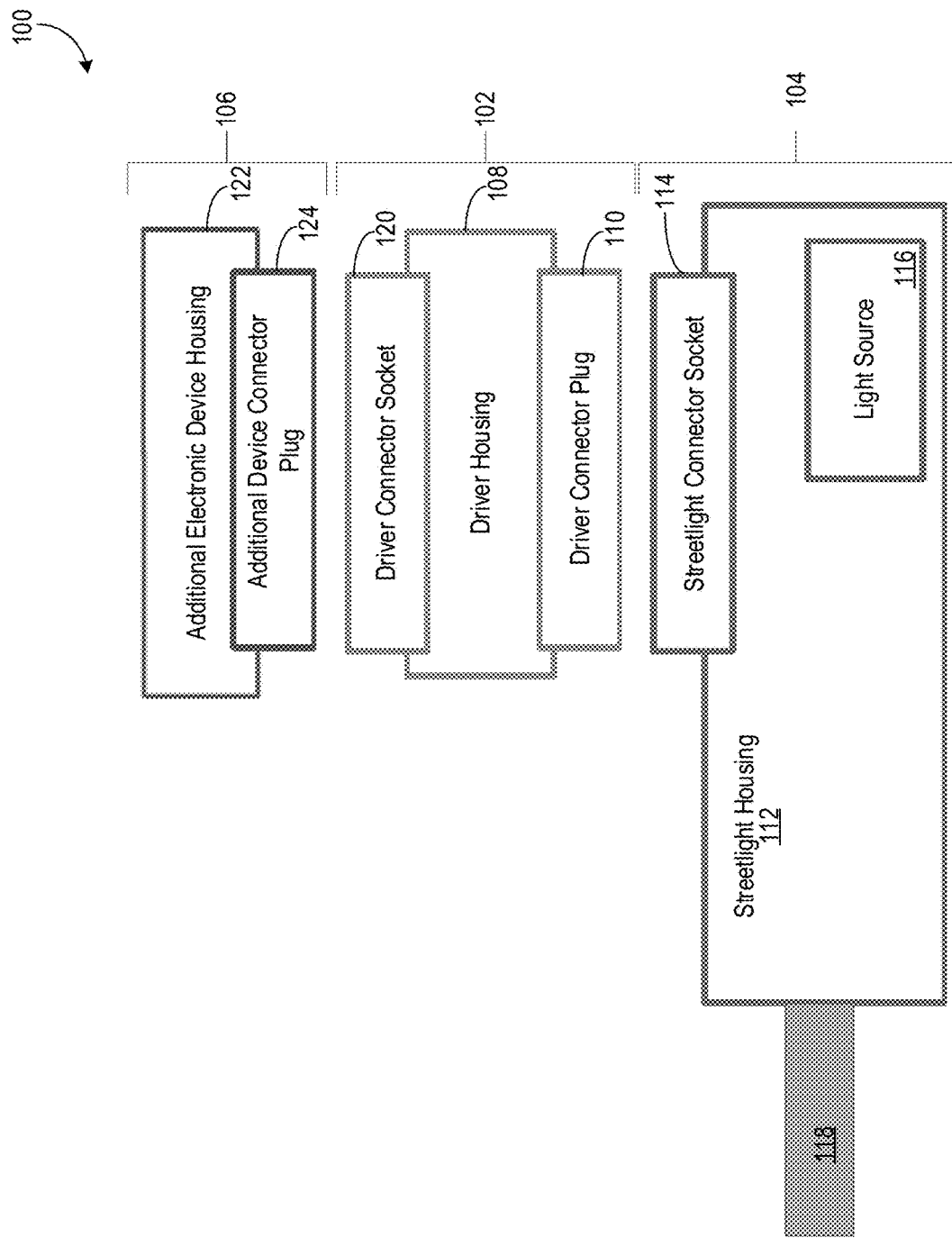
FIG. 1 shows a block diagram of an example streetlight system including a driver device.

This document describes a streetlight system including a streetlight and LED driver device disposed outside a housing of the streetlight. The driver device accepts power from a power source (e.g., a line from an electric grid of a power company) provided to the streetlight housing and drives one or more LED light source (LEDs), which are also in the streetlight housing. The driver device is coupled to the streetlight housing by an electrical connector. The driver is configured to connect to one or more additional electronic devices that are not included in the streetlight housing and in some aspects can electrically connect the one or more additional devices to the light source of the streetlight. The driver is housed by a weatherproof housing that provides a suitable operational environment (e.g., temperature) for circuitry of the driver. Disposing the driver device outside of the streetlight housing enables easy driver replacement that does not require accessing an interior of the housing and/or manipulation of any internal circuitry. Disposing the driver device outside of a streetlight housing can also make the device amenable to be removed by an automated device such as an unmanned aerial vehicle (sometimes referred to as a drone).

There are several drawbacks to disposing the driver device inside the streetlight housing as an integrated driver device. Generally, for streetlights with LEDs as light sources, an integrated driver device fails relatively quickly in comparison to the LEDs and other electronics of the streetlight. Thus, replacement of the integrated driver device is typically the most common repair of LED streetlight systems. When the integrated driver device is disposed within the streetlight housing, maintenance and/or repair of the driver device, should it fail, can be difficult and expensive. This is because, in such systems, the integrated driver device is generally integrated with the electronics of the light source inside the streetlight housing. The integrated driver device is generally configured to directly connect the light source of the streetlight with a source of power (e.g., power lines, etc.) because, for in-place upgrades early in the market evolution, the integrated driver device is being retrofitted to replace a ballast device of a gas bulb streetlight system. In new luminaires, the practice of embedding the LED driver within the luminaire housing has been continued. This has provided continuity both for the mechanical form of the luminaire and for the labor force that maintains the streetlight fleet. While this approach reduces economic friction as the fleet changes over to LED, it also provides opportunity for optimization of weight distribution, heat rejection, and maintenance practices.

To remove the integrated driver device, a repair technician opens the streetlight housing and manually disconnects the wires connecting the driver device. When a new driver device is installed, the technician manually reconnects the wires. The technician may need tools, such as crimping devices, wire cutters, etc. to install or remove the integrated driver device from the streetlight housing. The technician also handles the electrical circuitry directly, which may lead to inadvertent damage to other electronic elements of the streetlight. The integrated driver device is inaccessible to additional electronic devices that a user may which to connect to the driver device and that do not fit inside the streetlight housing.

Additionally, the streetlight housing provides a less than ideal environment for the integrated driver device's circuitry. Streetlight housings are generally enclosed and have temperature control mechanism, such as ventilation or cooling systems. The integrated driver device circuitry heats during use, which can result in failure of the circuitry (e.g., a failure of one or more capacitors of the integrated driver device's circuitry).

The streetlight system described herein addresses these potential issues with a driver device that is disposed outside of the streetlight housing. The driver device is not integrated with the electronics inside the streetlight housing directly such that wires must be manually disconnected or reconnected with tools by a technician. Instead, the driver device is positioned outside the streetlight housing. The wiring inside the streetlight housing is accessible from the exterior of the streetlight housing in a connector. The driver device includes a corresponding connector to enable a technician to replace the driver device without opening the streetlight housing and without directly handling the electronics of the streetlight system. The driver device is thus configured to be modular. The driver device can be connected to one or more additional devices (e.g., a controller, one or more sensors, etc.) so that the circuitry of the driver device is connected to the additional devices. The driver device provides a suitable operating environment for the circuitry of the driver device to extend the operational lifespan of the driver device circuitry. For example, the driver device includes a temperature control mechanism to prevent the operating environment of the driver device's circuitry from exceeding a temperature threshold. The driver device can also be accessed by an autonomous system (e.g., a drone) for automated or semi-automated replacement, further reducing maintenance costs.

FIG. 1 shows a block diagram of a streetlight system 100. The streetlight system 100 includes a power driver device 102 and a streetlight 104. The driver device 102 provides power for a light source 116 of the streetlight 104. The driver device 102 is configured to couple with a streetlight housing 112 of the streetlight 104 using driver connector plug 110 and the corresponding streetlight connector socket 114. The driver device 102 is disposed outside of the streetlight housing 112. In some implementations, the streetlight system 100 includes one or more additional electronic devices, such as electronic device 106. The electronic device 106 includes an electronic device housing 122 that houses any electronics of the additional electronic device 106. The electronic device 106 is configured to couple to the driver device 102 using an additional device connector plug 124 and a corresponding driver connector socket 120. All of the driver device 102, streetlight 104, and additional electronic device 106 of the streetlight system 100 are configured for operation in outdoor environments.

The driver device 102 includes a power driver (e.g., driver electronics 210 of FIG. 2) for providing power to the light source 116 at voltage and current levels that are suitable for operation of the light source 116. The light source 116 can include one or more light emitting diodes (LEDs). The LEDs of the light source 116 can be configured in an array to provide the light of the streetlight 104 during operation of the streetlight. The number and specifications of the LEDs can vary. For example, the light source 116 typically include LED arrays requiring 20-250 Watts at 85-264 VAC, and output of 12-24 VAC/DC to enable the light source 116 to output up to 2,000-20,000 lumens. However, these thresholds are examples—other voltage and current outputs can be generated by the driver device 102. In some implementations, driver device 102 generates a constant current output to the light source 116, in which the current output of the driver device 102 does not vary in response to changing conditions at the light source 116 (e.g., increased temperature). In this example, the voltage output of the driver device 102 varies as conditions change in order to ensure that the current output is constant or substantially constant. In some implementations, the driver device 102 generates a constant current output to the light source 116, in which the voltage output of the driver device 102 does not vary in response to changing conditions at the light source 116 (e.g., increased temperature). In this example, the output current of the driver device 102 varies (up to a maximum current) as conditions change in order to ensure that the voltage output remains constant or substantially constant for the light source 116, which can include an internal constant current driver. In some implementations, the driver device 102 can receive a dimming signal that causes the driver device 102 to modify the output voltage or output current and cause dimming or brightening of the light source 116 light output. The driver device 102 is described in further detail below with respect to FIGS. 2-3.

The driver device 102 is configured to couple to the streetlight housing 112 so that the driver device 102 is exterior to the streetlight housing 112. The housing 108 of the driver device 102 provides an environment suitable for operation of the driver electronics of the driver device 102. The operational environment provided by the driver housing 108 extends the operational life span of the driver electronics of the driver device 102 relative to the operational life span of driver electronics inside the streetlight housing 112. As described below, in one example, the driver housing 108 cools the driver electronics. Because the driver electronics are the primary failure mode for LED streetlights, increasing the operational life span of the driver electronics reduces maintenance on the streetlight overall.

The streetlight 104 includes lighting systems that are generally used for lighting infrastructure. While the term "streetlight" is used to describe the apparatus including the light source 116 that receives electrical input from the driver device 102, the streetlight 104 does not need to be configured to illuminate a street. The streetlight 104 can be configured to light any subject. Generally, streetlight 104 includes a lighting system that has been repurposed from an excited gas light source to an LED light source. However, this is also not a requirement. The streetlight 104 can include lights initially configured with an LED light source. In either case, the driver device 102 is positioned external to the streetlight housing 112.

The streetlight housing 112 (also called a luminaire) includes a shelter for the electronics and other electrical components of the streetlight 104. The streetlight housing 112 can be supported overhead by a support structure 118. The support structure can include any of a post, pole, building, etc. The streetlight housing 112 supports the driver device 102, which is coupled to the exterior of the streetlight housing 112 in order for the driver to provide power to the light source 116 of the streetlight 104. To couple to the streetlight housing 112, the driver device 102 includes a driver connector plug 110 that is configured to interface with a streetlight connector socket 114 on the streetlight 104.

In some implementations, the streetlight housing 112 includes a Cobra Head configuration that extends from the support structure 118 and houses the light source 116. A top surface of the streetlight housing 112 can include the streetlight connector socket 114. A bottom surface of the streetlight housing 112 can expose the light source 116 to an environment of the streetlight 104 for lighting the environment. In some implementations, the streetlight connector socket 114 can be on the same surface as the light source 116 so that the driver device 102 couples to the same portion of the streetlight housing 112 that exposes the light source 116 to the environment of the streetlight 104. Generally, the streetlight connector socket 114 is near to the light source 116 of the streetlight 104 to minimize a length of a path between the light source and the output of the driver device 102.

The additional electronic device 106 (additional device) includes a device that is configured to electrically couple to the driver device 102 and/or the streetlight 104 by way of the driver device 102. The additional device 106 includes a housing 122 and a connector plug 124 for coupling the additional device 106 to the driver device 102 (e.g., to corresponding driver connector socket 120). The connector plug 124 and the driver connector socket 120 are configured to electrically and physically connect the additional device 106 to the driver device 102.

The additional device 106 includes one or more electronic devices that interface with the driver device 102, the streetlight 104, or both. As described in further detail with respect to FIGS. 2-3 below, the additional device 106 can include a computing device, such as a controller, configured to control the light source 116 output of the streetlight 104. The controller can send dimming signals to the driver circuitry to control a brightness of the light source 116. In some implementations, the additional device 106 includes one or more sensors of a sensor package. For example, the additional device 106 can include a photocell that can detect the brightness of the environment of the streetlight 104 and cause the controller to automatically turn the light source 116 on or off. The sensor package can include atmospheric sensors, temperature sensors, barometers, cameras, and so forth that provide local environment data from the environment of the streetlight 104. In some implementations, other electrical devices can be coupled to the streetlight or the driver device 102, such as a transmitter.

The additional device 106 can be coupled to the driver device 102 in a stacking configuration with the streetlight 104. As described below, the driver device 102 can provide pass-through power to the additional device 106 from the streetlight 104 to power the additional device 106.

Figure 2:
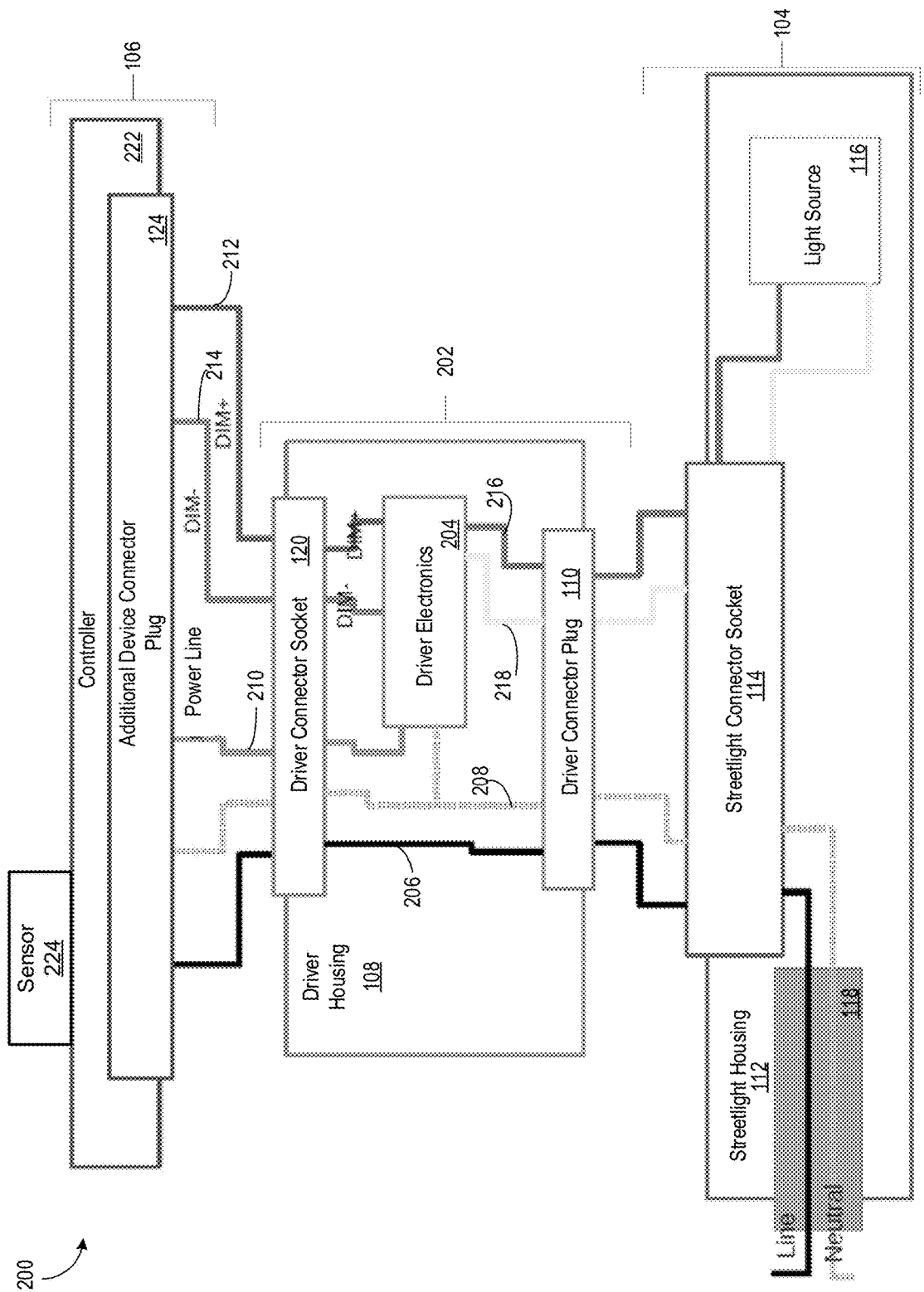
FIG. 2 shows a schematic diagram of circuitry in an example streetlight system including a driver device.

Turning to FIG. 2, a schematic of an example streetlight system 200 including a driver device 202 is shown. Similar to the streetlight system 100 described in FIG. 1, streetlight system 200 includes a streetlight 104, a driver device 202, and an additional device that includes a controller 222. In the streetlight system 200, the streetlight 104, driver device 202, and controller 222 are shown in stacking configuration, where the driver device 202 and the controller 222 are stacked on top of the streetlight 104. However, other geometrical configurations of the streetlight 104, driver device 202, and controller 222 are possible where the electrical connections shown in the schematic of FIG. 2 are preserved. For example, the controller 222 can be on a side of the driver device 202. The driver device 202 and the controller 222 can be underneath the streetlight 104. In some implementations, another electronic device can be disposed between the controller 222 and the driver device 202 if the other electronic device preserves the electrical connections shown in FIG. 2.

A power line 206 and a neutral line 208 are provided from a power source, such as an electric grid. The power line 206 and the neutral line 208 are provided to the driver device 202 by the streetlight housing 112, such as through the support structure 118. In a typical streetlight, the power line 206 feeds through a driver device inside the streetlight housing 112 to the light source 116 of the streetlight. In FIG. 2, the power line 206 and the neutral line 208 pass through the streetlight connector socket 114. The streetlight connector socket 114 exposes the power line 206 and the neutral line 208 to the exterior of the streetlight housing 112. The power line is typically alternating current (AC) power, at 120 V or 240 V.

The driver device 202 includes a driver connector plug 110 configured to interface with the streetlight connector socket 114. The driver connector plug 110 and the streetlight connector socket are configured to physically couple the driver device 202 to the streetlight housing 112 and to electrically connect the driver electronics 204 to the light source 116. In some implementations, the streetlight connector socket 114 includes a C136.41 socket, and the driver device 202 includes a corresponding C136.41 plug. In some implementations, the streetlight housing 112 includes a modified C136.41 socket, and the driver device 202 includes a modified C136.41 plug that is similarly modified to form a modified C136.41 connector. The C136.41 connector can be modified to accommodate the power line 206, the neutral line 208, and the first driven output of the power line 216 (e.g., LED+ power) and the second power line 218 (e.g., LED− power), each on one on four respective pins of the C136.41 connector.

The driver connector plug 110 and corresponding streetlight connector socket 114 form a first connector. The first connector is watertight and protects the electrical connectors (e.g., power line 206 and neutral line 208, etc.) from the environment external to the streetlight 104. The connector can include a plug and socket, as described above, but can include other coupling means as well. For example, connector can include threads for quarter-turn, eighth-turn, etc. connections that securely fasten the driver device 202 to the streetlight 104.

The power line 206 and the neutral line 208 pass into the driver housing 108 of the driver device 202. In FIG. 2, the power line 206 and the neutral line 208 are configured to pass through directly to the driver connector socket 120 to power an additional device, such as controller 222. However, in some implementations, the power line 206 and the neutral line 208 are configured to connect to the driver electronics 204 directly. For example, if no controller 222 is connected to the driver device 202, the driver electronics 204 provide power to the light source 116 directly from the power line 206 and neutral line 208.

In FIG. 2, the power line 206 passes through the driver device 202 to the controller 222. A second connector is formed from the driver connector socket 120 and the additional device connector plug 124. The second connector can be identical to or similar to the first connector.

Here, the driver connector socket 120 and the additional device connector plug 124 each include at least five pins: a first pine for the power line 206, a second pin for the neutral line 208, a third pin for the controller power output 210, a fourth pin for a first dimming signal 212 (e.g., a DIM+ signal), and a fifth pin for a second dimming signal 214 (e.g., a DIM− signal). Other pins can be included for additional signals or alternative signals, such as if a different additional device 106 is connected to the driver device 202.

The power line 206 and the neutral line 208 connect to the controller 222 (or other additional device 106) and power the controller. The controller 222 sends a signal on the power line 210 to the driver electronics 204 through the second connector. The power line 210 can be a pass-through power line, in which the controller draws power from the power line 206 and passes the remaining power by power line 210 to the driver electronics 204 for powering the light source 116.

The controller 222 is configured to provide control signals to the driver electronics 204 of the driver device 202. For example, the first dimming signal 212 (e.g., a DIM+ signal), and the second dimming signal 214 (e.g., a DIM− signal) are provided to the driver electronics 204 to set the output current or voltage of the driver device 202 to the light source 116 and control the brightness of the light source.

The driver electronics 204 receive the control signals 212, 214, the neutral line 208, and power from either power line 206 or from power line 210. In some implementations, the driver device 202 can be configured to detect that power line 210 is providing power to the driver electronics 204 from the controller 222. The driver device 202 can close a switch (not shown) to shut off power from power line 206 (in cases where both power sources can be connected to the power electronic 204). The switch includes a passive switch that does not require an activation signal by a processing device.

The driver electronics 204 drive the output on the power lines 216, 218 for the light source 116 as described above in reference to FIG. 1. The driver electronics 204 are maintained by the driver housing 108 in an environment that increases the life span of the driver electronics, relative to a life span of the driver electronics if stored inside the streetlight housing 112. For example, the driver electronics include one or more capacitors. Typically, each 10° C. temperature rise in the operating environment of the one or more capacitors can reduce capacitor life by approximately 50%. The driver housing 108 can include a cooling mechanism (as described in relation to FIG. 3, below) to reduce the operating temperature of the driver electronics 204 and increase the relative life span of the driver electronics. The increased life span of the driver electronics 204 reduces a frequency in which the driver device 202 is maintained. Because the driver device 202 is located near the streetlight housing 112 (e.g., coupled to the streetlight housing), maintenance is relatively difficult and can be expensive. The increased life span of the driver device 202 therefore reduces maintenance expenses of the streetlight system 200. In some implementations, the driver electronics 204 can include a switching mode power circuit for converting the AC input on the power line 206 to a DC output on the power line 216 suitable for the light source 116. Various driver circuits can be included in the driver electronics 204. The driver electronics 204 include an LED driver configured to provide power for a light source that includes LEDs. In some implementations, the controller 222 configures the driver device 202 to provide the appropriate power line 216 to the light source 116.

The controller 222 is configured to send dimming commands to the streetlight by the lines 212, 214 that include electrical connections (e.g., wires). In some implementations, dimming can be controlled, for example, using a 1-10V lighting control or a Pulse Width Modulation (PWM) interface. The lines 212, 214 extend from the controller 222 out of a housing of the additional device 106. The driver device connector socket 120 is configured to receive the dimming lines 212, 214 and electrically connect them to the driver electronics 204. The additional device 106 is thus modular with the driver device 202.

The controller 222 can include one or more processing devices, described in detail with respect to FIG. 7. The controller 222 can be configured to communicate (e.g., by a transceiver) to another remote computing device for controlling operation of the streetlight 104 and the driver device 202. For example, the controller 222 can send commands to the driver device 202 to dim the light source 116 of the controller in response to receiving a signal from a photocell. In some implementations, the controller 222 is configured to receive one or more inputs from sensor(s) 224. The sensor 224 can include a transceiver, photocell, atmospheric sensor(s), camera(s), temperature probe(s), and so forth. Inputs from the sensor(s) 224 are received by the controller 222, which can control the light source 116 of the streetlight 104 and the driver device 202 in response to receiving the signal(s). In some implementations, the sensor 224 is connected to the controller 222 in a modular fashion, using a similar connector as the additional device connector plug and driver connector socket 120. In some implementations, the sensor 224 is included with the controller 222 in a single housing.

Figure 3:
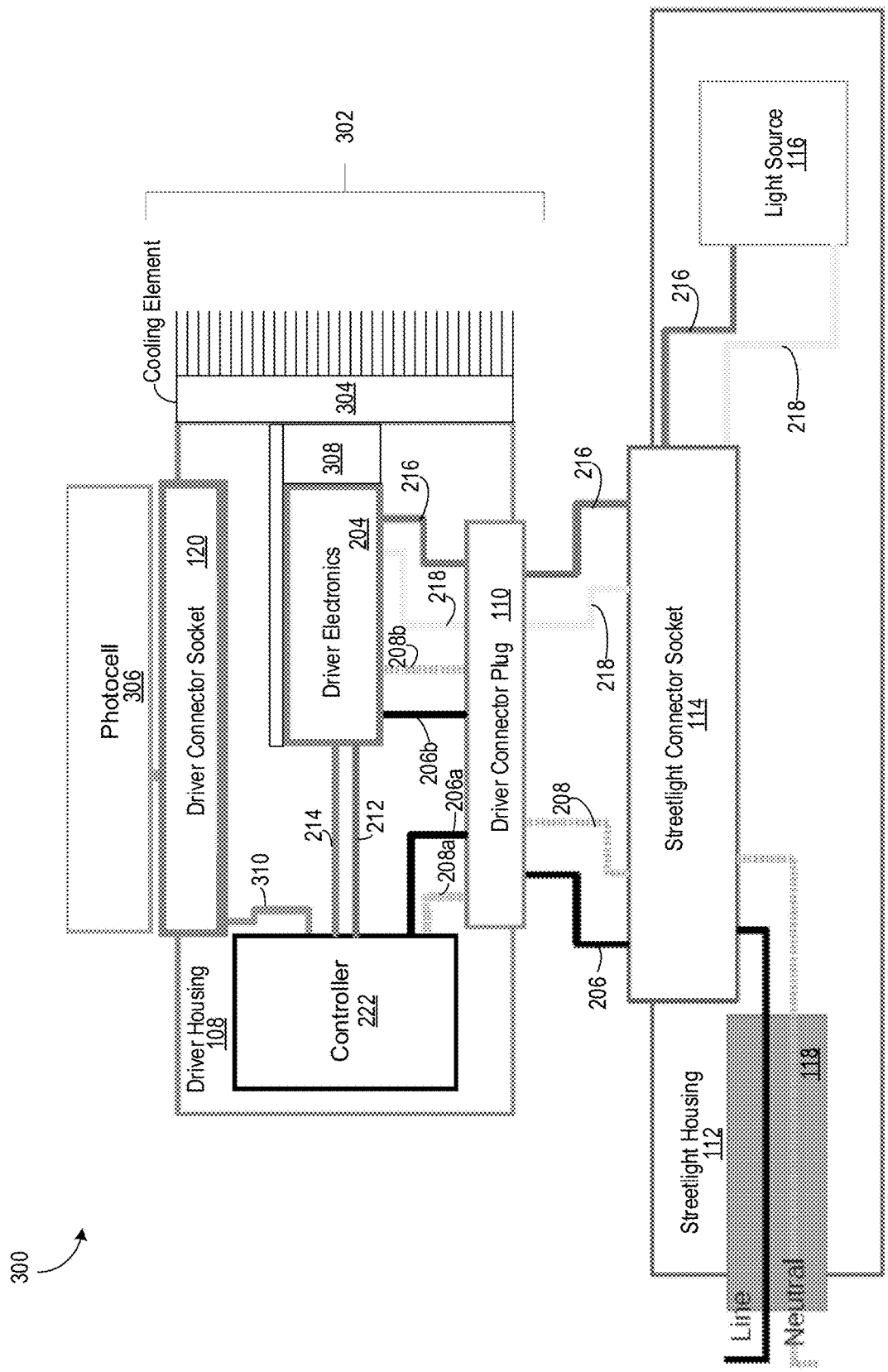
FIG. 3 shows a schematic diagram of another example streetlight system including a driver device.

Turning to FIG. 3 a schematic of an example streetlight system 300 including a driver device 302 for interfacing with a streetlight 114 is shown. The streetlight system 300 is similar to the streetlight system 200, except that a driver device 302 includes the controller 222 of FIG. 2 within the driver housing 108. The controller 222 receives the input on the power line 206 and neutral line 208 directly from the driver connector plug 110. In some implementations, the power line 206 and the neutral line 208 are also wired to directly connect to the driver electronics 204 without requiring a connection to the controller. In some implementations, power line 206 is split into two inputs 206a, 206b, and neutral line 208 is split into two inputs 208a, 208b, respectively.

The controller 222 sends dimming signals 212, 214 to the driver electronics 204 within the driver device 302. The driver electronics 204 can receive the dimming signal 212, 214 and control the brightness of the light source 116 by changing the output on power line 216 current or voltage as appropriate. In some implementations, the driver electronics 204 receive the power line 206b and neutral line 208b and convert to voltage and current on the power line 216 suitable for an LED light source 116.

The controller 222 is configured to receive signals from one or more sensors, as described with respect to FIG. 2, above. Because the controller 222 is within the driver device 302, the driver connector socket 120 of the driver device 302 includes one or more pins for receiving the signals from sensors that are coupled to the driver device 302 by the driver connector socket 120. In FIG. 3, a photocell 306 is coupled to the driver device 302. The photocell includes a sensor configured to detect an amount of light at the photocell and output a signal 310 to the controller 222 representative of the measured amount of light. In this document, reference to a photocell can include the entire photocell sensor package, rather than just the light-sensitive sensor itself. For example, if the photocell is housed in a sensor package with other sensors, computing devices, etc., the entire sensor package may be referred to as a "photocell" that is coupled (e.g., affixed) to the streetlight. Photocells can be used for switching individual streetlights on and off based on ambient light conditions. A system can use the photocells to make lighting decisions either manually or autonomously based on ambient weather conditions. In some implementations, the photocell is in communication with a streetlight controller configured to control the streetlight, either autonomously or in response to instructions received from a remote computing system.

The controller 222 is configured to receive the signal 310 from the photocell 306 and send a dimming signal 212 to the driver electronics 204. The dimming signal 212 can indicate that the light source 116 is to turn off completely. For example, if the environment of the streetlight 104 includes a lot of ambient light, such as on a sunny day, the controller 222 may send a signal to the driver electronics 204 to output no power to the light source 116. Other sensors can be included so that the controller 222 can adjust operation of the light source 116 of the streetlight 104 for various reasons. While the photocell 306 is shown to be coupled to the driver device 302 on an opposing side of the driver device with respect to the streetlight 104 (e.g., a stacking configuration), other configurations are possible. For example, the photocell 306 can be affixed to a side of the driver device 302.

The driver device 302 is configured to increase the life span of the driver electronics 204 by maintaining a favorable operating environment for the driver electronics. For example, a cooling element 304 can be coupled to the driver device 302 to remove heat from the driver device 302 and/or the driver electronics 204 by a heat conduit 308. The cooling element 304 shown is a heat sink, but other cooling elements can be used. For example, the cooling element 304 can include a sunshade, a fan, a vent, a liquid coolant system, etc.

While the cooling element 304 is shown to be on the side of the housing 108 of the driver device 302, the cooling element 304 can be in other configurations. For example, the cooling element 304 can include a heat sink that surrounds the driver device 302, slats of a vent in the side, top, and/or bottom of the housing 108, etc.

In some implementations, a cooling tower can extend from the driver device housing 108. The tower absorbs heat (e.g., from the environment of the driver device) and draws up air through ventilation intake holes in the bottom of the driver device housing 108. The ventilation holes are included on one or both sides of the cooling tower to allow warmer air to escape from the driver device housing 108. The tower thus causes convective cooling of the interior of the driver device 202 through its geometry. The driver electronics 204 can be placed near the bottom of the driver device housing 108, while components resistant to heat can be placed closer to the tower 510 or inside the tower. This configuration enables cooling of the driver electronics 204 without any moving parts.

In some implementations, a sunshade can be placed on the driver device 202 to reduce heat absorption by the driver device. The sunshade is configured to obstruct sunlight from reaching the housing 108. The housing 108 can include a heat sink that is cooled by environmental factors (wind, rain, etc.). In some implementations, a sunshade (or plurality thereof) is temperature-sensitive. The sunshade can be configured to pass variable amounts of light to the housing, such as an amount of light that is inversely proportional to a temperature of the sunshade. In some implementations, the sunshade comprises a solar cell that is configured to provide power to the controller 222. In some implementations, an air gap exists between the sunshade and housing 108. The air gap is configured to cause cooling air convection in the air gap from the housing 108, cooling the housing. A heat sink can be placed in the air gap so that the heat sink is cooled by an airstream in the air gap. For example, one or more blades of the heat sink are exposed to a convection air current in the air gap.

FIGS. 4A-4D show example form factors for a driver device 400 for interfacing with a streetlight. The driver device can include the driver device 102 of FIG. 1, driver device 202 of FIG. 2, or driver device 302 of FIG. 3. While a particular form factor is shown in FIGS. 4A-4D, other form factors are possible. The driver device 400 can include connectors 404, 410 on opposing sides, such as the additional device driver connector socket 120 and the driver connector plug 110, respectively, as shown in driver devices 102, 202, and 302 in FIGS. 1-3. In some implementations, the connectors can be on joined sides of the driver device 400, such that one connector is on a bottom of the device and another connector is on a side of the device.

The driver device housing 406 (e.g., housing 108 of FIGS. 1-3) can be a square prism, a cylinder, an irregular shape, etc. In some implementations, the geometry of the housing 406 can form to the curve of a cobra head streetlight. In some implementations, the exterior of the housing 406 is semi-rigid to conform to the shape of the streetlight 104 when the driver device 400 is coupled to the streetlight, so that the driver device 400 is capable of connecting to streetlights of any shape. For example, the housing 406 can include a rubber material on one or more sides. In some implementations, the housing 406 is rigid to protect the driver electronics 204. The housing 406 can include aluminum, carbon fiber, steel, etc.

Figure 4B:
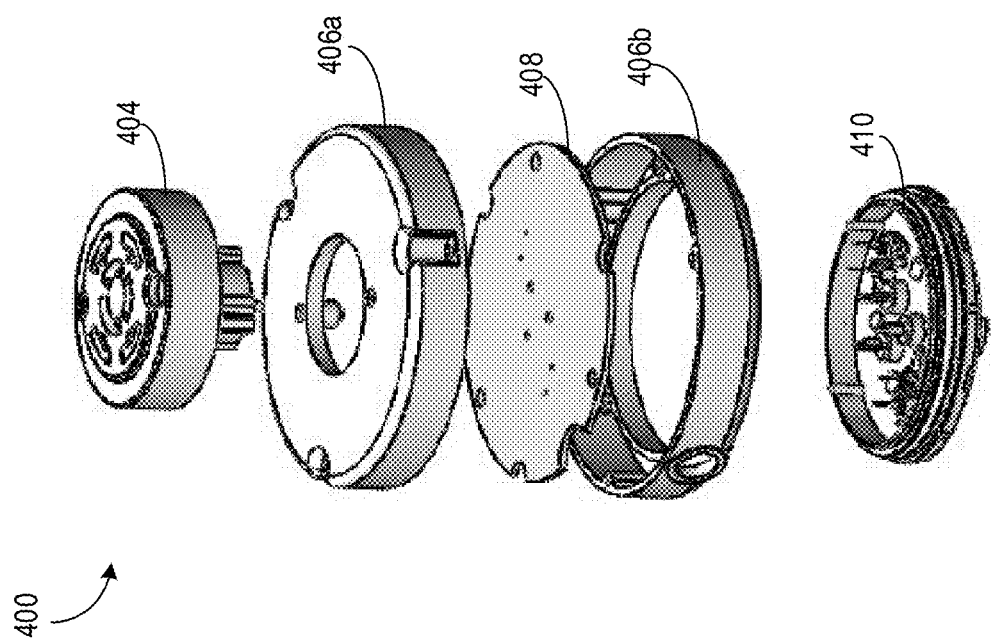
Figure 4A:
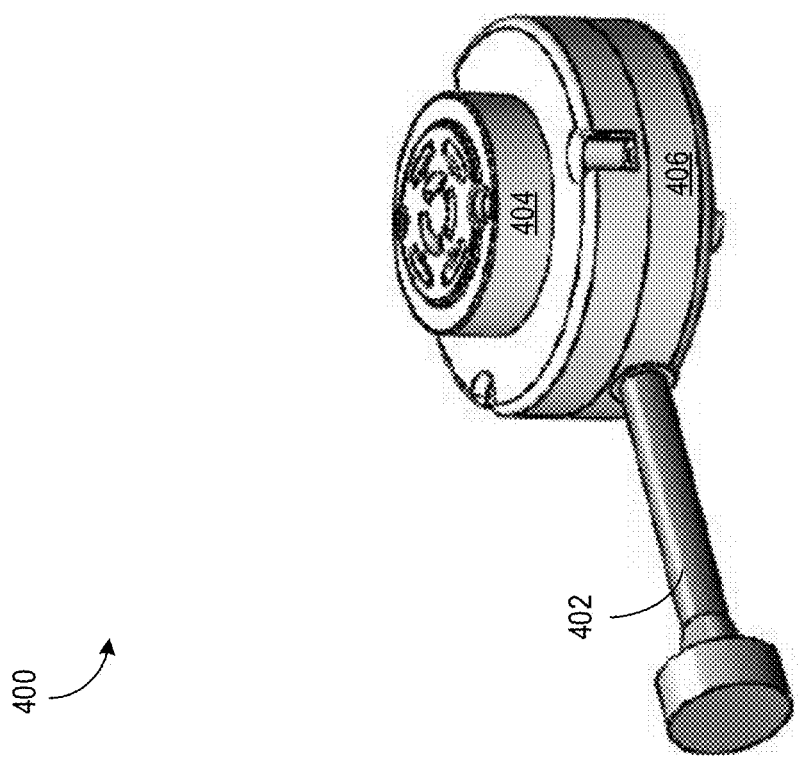

Turning to FIG. 4A, the driver device 400 is shown from a perspective view. The driver housing 406 is approximately cylindrical. In some implementations, a trunk cable 402 extends from the driver housing 406. For example, the trunk cable 402 extends towards a pole supporting the streetlight housing 112. The trunk cable 402 can house connections that carry power and sensor signals to/from the driver housing 406. In some implementations, the trunk cable 402 includes an IP67 connector. In some implementations, the trunk cable is at least three feet in length.

A connector 404 is shown which includes the driver connector socket 120. The connector 404 can accept additional devices to interface with the driver device 400 when the driver device is connected to the streetlight housing 112. In some implementations, the streetlight housing 112, driver device 400, and an additional device are in a stacking configuration. In some implementations, the connector 404 is a C136.41 socket.

Turning to FIG. 4B, an exploded perspective view of the driver device 400 is shown. The connector 404 includes a plug for interfacing with an additional device. The driver device housing 406 is shown in parts 406a and 406b. In this example, the housing 406 is rigid and can be formed from materials such as carbon fiber, plastic, metal, etc. In some implementations, a printed circuit board (PCB) 408 is sized to connect the driver electronics of the driver device 400 and conform to a seating provided by the housing 406. A connector 410 is configured to connect the electronics of the driver device 400 and any additional device connected to the driver device by connector 404 to the streetlight electronics (not shown). The connector 410 can include the driver connector plug 110 of FIGS. 1-3. The connector 410 is configured to interface with a streetlight connector socket of the streetlight housing. In some implementations, the connector 410 is a modified C136.41 socket. The connector 410 is configured to connect a power line and a neutral line (e.g., lines 206, 208 of FIGS. 2-3) from a power source external to the driver device 400, such as from the streetlight. The connector 410 is configured to connect the LED signal lines (e.g., lines 216, 218 of FIGS. 2-3) to the light source (e.g., light source 116).

FIG. 4C shows a cross-section of the driver device 400 from a side view. FIG. 4D shows the driver device from a side view. FIG. 4C is the cross-section shown along axis A in FIG. 4D.

In some implementations, the housing 406 of the driver device 400 can include one or more markings to assist with autonomous removal/installation of the driver device by an unmanned aerial vehicle (UAV). The markings can be configured to guide the UAV to orient itself above the driver device 400 when installing and/or removing the driver device from the streetlight. The markings can also assist the UAV in installing and/or removing one or more sensors attached to the driver device 400, such as a photocell. Alternatively, or in addition, the driver device 400 can be shaped to assist the UAV (or a human user) in grasping the driver device 400 during installation and/or removal of the driver device from the streetlight 104. For example, the driver device 400 can include grips on its exterior for coupling with a handler device of the UAV The driver device 400 can further include a handle that extends from the exterior of the device to assist a user (UAV, human, etc.) in grasping and turning the driver device 400 for coupling the driver device to the streetlight 104 or coupling one or more sensors to the driver device. The driver device 400 can include one or more notches to enable the UAV (or human user, etc.) to grasp the driver device for installation and/or removal from the streetlight 104.

In some implementations, the driver device 400 can include a status light on the exterior of the housing 108 to alert a UAV or a user that the driver electronics 204 (or another portion of the driver device 400) is failing. For example, the light can be an LED controlled by the controller 222.

Figure 5A:
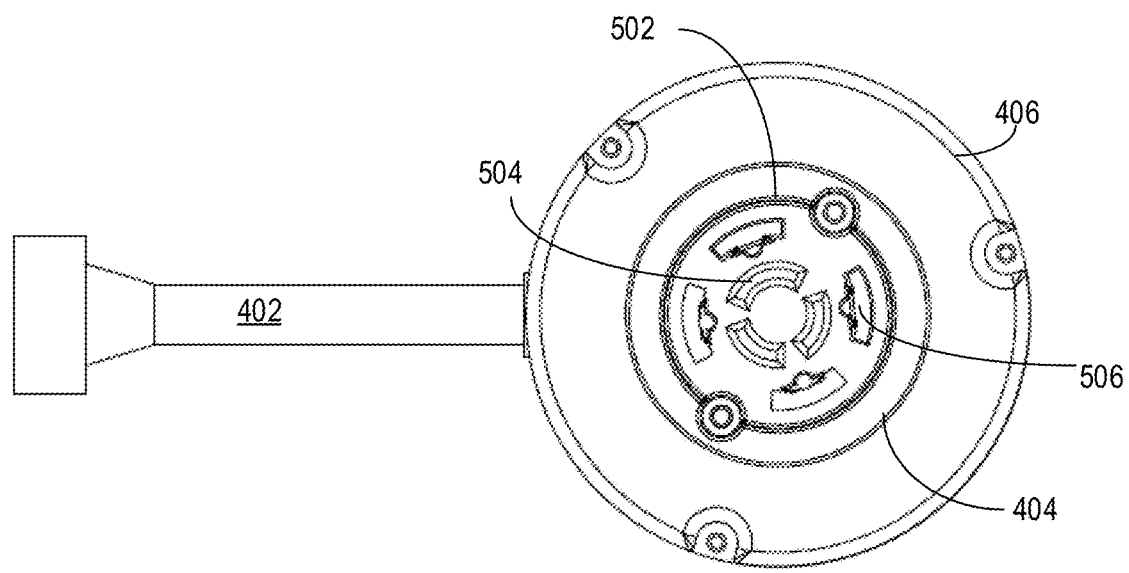
FIGS. 5A-5B show example connectors for use in the driver devices of FIGS. 1-4D.
Figure 5B:
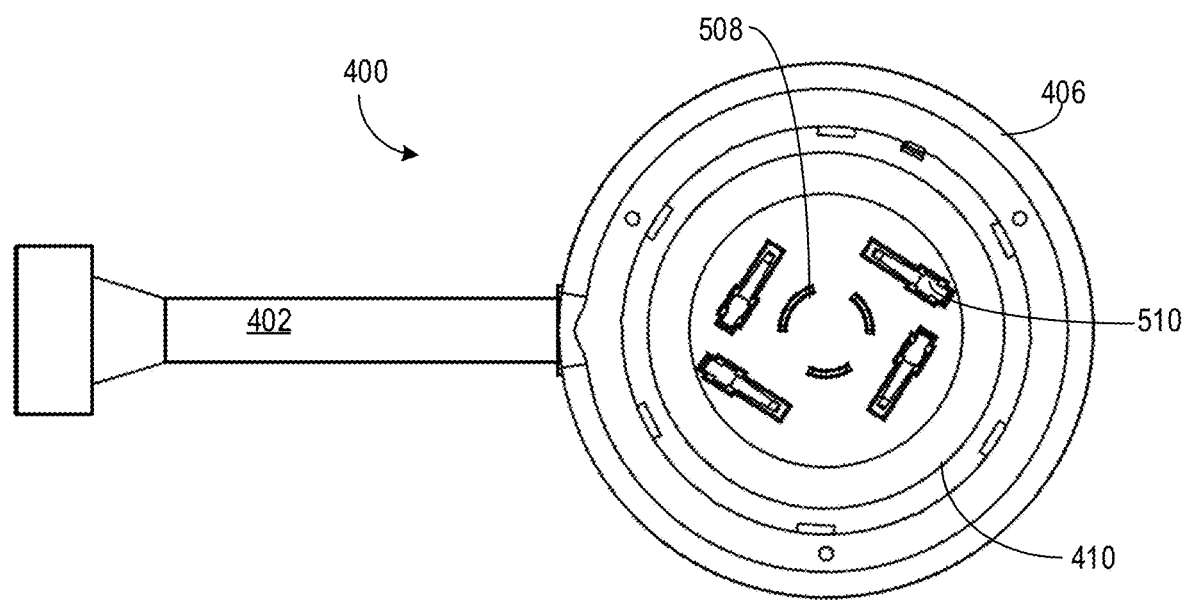

Turning to FIGS. 5A-5B, example connectors for use in the LED driver devices of FIGS. 1-4D are shown. FIG. 5A shows a top view of the driver device 400 of FIGS. 4A-4D. The connector 404 extends from a top of the housing 406. The connector 404 can include the driver connector socket 120 of FIGS. 1-3. In some implementations, the connector 404 includes a C136.41 socket. The connector 404 includes threaded sides 502 for allowing a quarter turn interlock, an eighth-turn interlock, or other rotating interlock. The connector 404 includes sockets 504 for receiving plug contacts from an additional device, such as a photocell, streetlight controller, or other additional device. While connector 404 has three sockets 504 and four contacts 506, other numbers of sockets and contacts can be used and other configurations are possible. The connector 404 forms a portion of the driver connector plug 110 and the streetlight connector socket 114 interface. In each of these examples, the connector 400 is affixed to the driver device 202 housing 406, and the connector is configured to interlock with a corresponding portion of the additional device 106.

FIG. 5B shows a bottom view of the driver device 400 of FIGS. 4A-4D. A connector 410 is shown. Connector 410 can include the driver connector plug 110 of FIGS. 1-3. In some implementations, the connector 410 is a modified C136.41 plug. The connector 410 is configured to couple the driver device 400 to the streetlight housing 112. The connector 410 enables the driver device 400 to electronically couple to electronics of the streetlight and drive the light source of the streetlight. The connector 410 connects the driver device 400 to a power source, such as from the streetlight. The connector 410 includes plugs 508 and contacts 510. The plugs 508 generally are metallic and are configured to interface with corresponding sockets of a connector of the streetlight housing (e.g., streetlight connector socket 114 of FIGS. 1-3). The contacts 510 generally are metallic and configured to abut corresponding contacts of the streetlight connector. While three plugs 508 are shown in a circular configuration, any number of plugs can be used in varying geometries. Additionally or alternatively, while four contacts 510 are shown, any number of contacts 510 can be used in any geometric configuration.

The connector 410 includes at least four pins for the streetlight-driver device interface, one for each of the power line 206, neutral line 208, light source power line 216, and light source return power line 218, respectively. The connector 404 includes at least five pins for the driver device-additional device interface, one for each of the power line 206, neutral line 208, dimming signal 212, dimming signal relative 214, and driver electronics power line 210, respectively.

As stated above, either connector 404, 410 can include threads for coupling two devices. The threads can be on the inside of a surface to help create a watertight seal. A rubber lining (or other material) can be added to further seal the connector. In some implementations, rather than threads, a slip latch can be included in the connector to fasten two devices together. Once the devices are coupled, the slip latch can require some other means to release the devices, such as a turn of one of the devices. In some implementations, the connectors 404, 410 can include a plug or socket without an additional locking mechanism. In this case, the locking mechanism can be included elsewhere on the housing 406 of the driver device 404.

Figure 6:
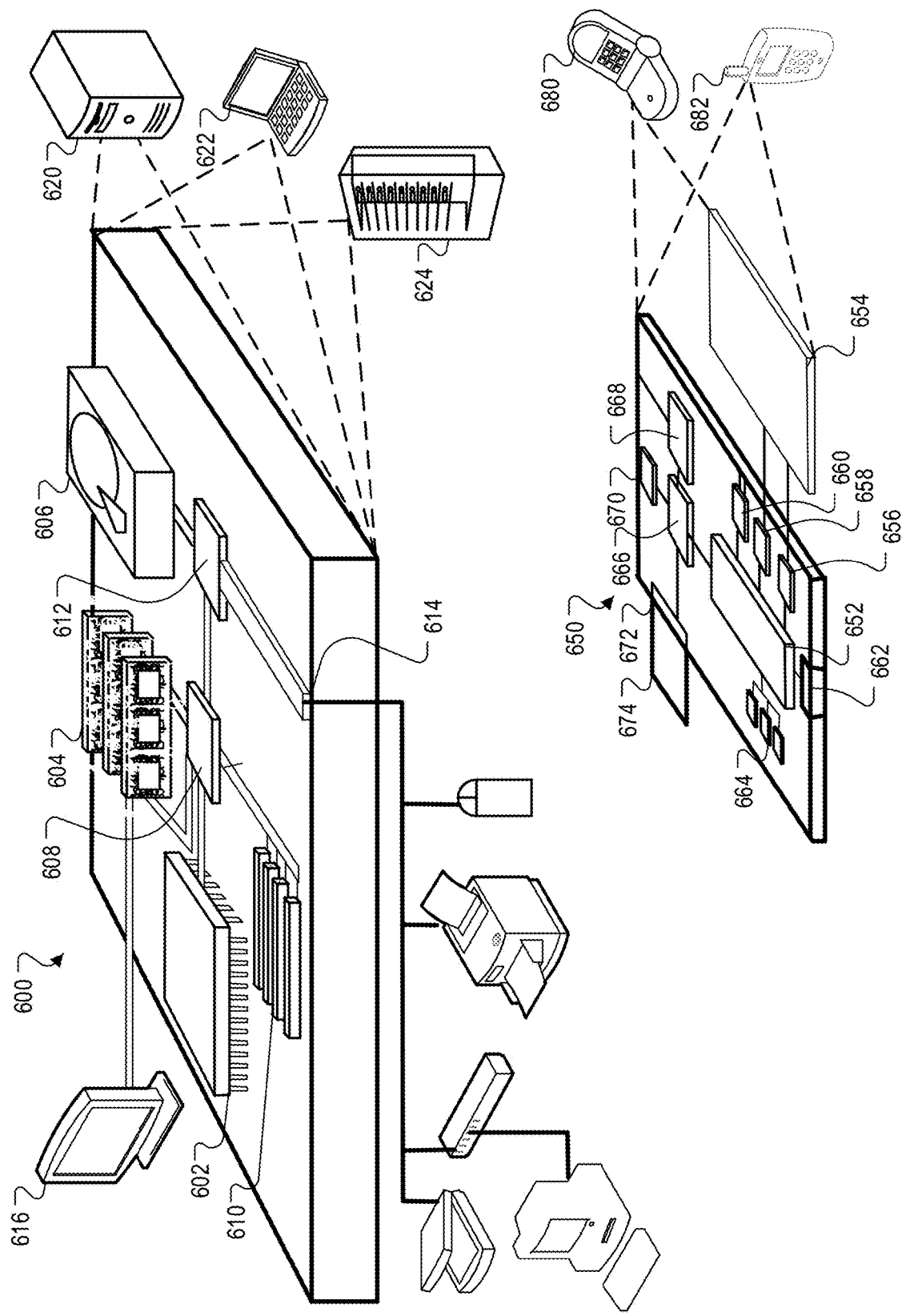
FIG. 6 shows examples of computing devices that may be used in implementing technology described herein.

FIG. 6 is a block diagram of computing devices 600, 650 that may be used to implement the computing systems described above (e.g., controller 222), as either a client or as a server or plurality of servers. Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smartphones, and other similar computing devices. Additionally computing device 600 or 650 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed controller 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid-state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high-speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, and an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. Additionally, the processor may be implemented using any of a number of architectures. For example, the processor 610 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT (Thin-Film-Transistor Liquid Crystal Display) display or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, so as to enable near area communication of device 650 with other devices. External interface 662 may provide, for example, for wired communication in some implementations, or for wireless communication in other implementations, and multiple interfaces may be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In-Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652 that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may include sound generated by applications operating on device 650.

The computing device 650 may be implemented in a number of different forms, as shown in the figure. For example, it may be implemented as a cellular telephone 680. It may also be implemented as part of a smartphone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back-end component (e.g., as a data server), or that includes a middleware component (e.g., an application server), or that includes a front-end component (e.g., a client computer having a graphical user interface or a Web browser through which a user can interact with an implementation of the systems and techniques described here), or any combination of such back-end, middleware, or front-end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Other embodiments are within the scope and spirit of the description claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

It will thus be seen that the objects set forth above, among those made apparent from the preceding description, are efficiently attained and, because certain changes may be made in carrying out the above method and in the construction(s) set forth without departing from the spirit and scope of the disclosure, it is intended that all matter contained in the above description and shown in the accompanying drawings shall be interpreted as illustrative and not in a limiting sense.

A number of exemplary implementations of LED driver system have been described. Nevertheless, it will be understood by one of ordinary skill in the art that various modifications may be made without departing from the spirit and scope of the described embodiments.

What is claimed is:

1. A streetlight system, comprising:
   a streetlight housing that houses a light source; and
   a driver device comprising a driver circuit for driving the light source in the streetlight housing, the driver device disposed outside the streetlight housing;
   a first connector configured to couple the streetlight housing to the driver device to electrically connect the driver circuit to the light source; and
   a second connector configured to couple the driver device to an additional device to provide an electrical connection to the additional device through the driver device,
   wherein the driver circuit is configured to receive electrical power through the connector from a power source in the streetlight housing.

2. The streetlight system of claim 1, wherein the light source comprises one or more light emitting diodes (LEDs).

3. The streetlight system of claim 1, wherein the first connector is on a first side of a housing of the driver device and wherein the second connector is on a second, opposite side of the housing of the driver device, wherein the housing of the driver device is configured to couple to the streetlight housing and the additional device in a stacking configuration.

4. The streetlight system of claim 3, further comprising a pass-through circuit from the first connector to the second connector configured to electrically connect the power source to the additional device.

5. The streetlight system of claim 3, wherein the driver circuit is connected to the second connector to drive the electrical power from the power source for the additional device.

6. The streetlight system of claim 3, wherein the additional device comprises a controller configured to communicate with a remote device and control the electrical power provided to the light source.

7. The streetlight system of claim 6, wherein the second connector comprises one or more ports for connecting one or more respective control lines from the controller to the driver circuit.

8. The streetlight system of claim 6, wherein the controller is configured to provide a dimming signal to the driver circuit, and wherein the driver circuit is configured to adjust the electrical power provided to the light source in response to the dimming signal.

9. The streetlight system of claim 1, wherein the driver device comprises a controller that comprises one or more processing devices, wherein the controller is configured to send a control signal generated by the one or more processing devices to the driver circuit.

10. The streetlight system of claim 9, wherein the controller is configured to provide scheduling of operation of the light source and wherein the controller is configured to store data representing operating parameters of the light source.

11. The streetlight system of claim 1, wherein the driver device comprises a cooling element configured to reduce an operating temperature of at least portion of the driver circuit from a baseline operating temperature without the cooling element.

12. The streetlight system of claim 1, wherein the driver device comprises one or more markings that provide orientation information to a remote device for autonomous connection or removal of the driver device with the streetlight housing.

13. The streetlight system of claim 1, wherein the driver device comprises a semi-rigid surface configured to conform to the streetlight housing.

14. A driver device for a streetlight, comprising:
a driver circuit configured to receive electrical power from a power source for driving a light source disposed in a streetlight housing;
a housing that houses the driver circuit;
a first connector on the housing configured to couple with a connector of the streetlight housing and connect the driver circuit to the power source and to the light source;
a second connector on the housing configured to couple with an additional device that is external to the housing and external to the streetlight housing; and
a pass-through connection from the first connector to the second connector to electrically connect the additional device to the light source.

15. The driver device of claim 14, wherein the light source comprises one or more light emitting diodes (LEDs).

16. The driver device of claim 14, wherein the first connector is on a first side of the housing, wherein the second connector is on a second, opposite side of the housing, and wherein the housing is configured to couple to the streetlight housing and the additional device in a stacking configuration.

17. The driver device of claim 14, further comprising a pass-through circuit, included in the pass-through connection from the first connector to the second connector, the pass through circuit configured to electrically connect the power source to the additional device.

18. The driver device of claim 14, wherein the additional device comprises a controller configured to communicate with a remote device and control the electrical power provided to the light source.

19. The driver device of claim 14, further comprising a controller that is housed in the housing, the controller comprising one or more processing devices, wherein the controller is configured to send a control signal generated by the one or more processing devices to the driver circuit.

20. The driver device of claim 19, wherein the controller is configured to provide scheduling of operation of the light source and wherein the controller is configured to store data representing operating parameters of the light source.

21. The driver device of claim 14, wherein the second connector comprises a C136.41 socket.

22. The driver device of claim 14, wherein the housing comprises a cooling element configured to reduce an operating temperature of at least portion of the driver circuit from a baseline operating temperature without the cooling element.

23. The driver device of claim 22, wherein the cooling element comprises a sun shield.

24. The driver device of claim 22, wherein the cooling element comprises a heat sink on an exterior of the housing, the heat sink being in thermal communication with the driver circuit.

25. The driver device of claim 14, wherein the driver circuit comprises a switching mode power circuit.

26. The driver device of claim 14, wherein the housing comprises one or more markings that provide orientation information to a remote device for autonomous connection or removal of the first connector with streetlight housing.

27. The driver device of claim 14, wherein one or both of the first connector and the second connector comprises an approximately eighth-turn to quarter-turn locking mechanism.

* * * * *